United States Patent
Mitrovic

(10) Patent No.: US 7,015,414 B2
(45) Date of Patent: Mar. 21, 2006

(54) METHOD AND APPARATUS FOR DETERMINING PLASMA IMPEDANCE

(75) Inventor: Andrej S. Mitrovic, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 77 days.

(21) Appl. No.: 10/673,321

(22) Filed: Sep. 30, 2003

(65) Prior Publication Data

US 2005/0067386 A1    Mar. 31, 2005

(51) Int. Cl.
*B23K 10/00* (2006.01)

(52) U.S. Cl. ................... 219/121.43; 219/121.41; 219/121.57; 118/723 I; 156/345.48; 156/345.28

(58) Field of Classification Search ......... 219/121.54, 219/121.57, 121.43, 121.4, 121.41; 156/345.48, 156/345.28; 118/723 I
See application file for complete search history.

(56) References Cited

U.S. PATENT DOCUMENTS

| | | | |
|---|---|---|---|
| 6,447,636 B1 * | 9/2002 | Qian et al. ............. | 156/345.48 |
| 6,592,710 B1 * | 7/2003 | Benjamin et al. ...... | 156/345.48 |
| 6,853,953 B1 * | 2/2005 | Brcka et al. ............ | 702/182 |
| 6,858,112 B1 * | 2/2005 | Flamm et al. .......... | 156/345.48 |
| 6,884,635 B1 * | 4/2005 | Parsons ................... | 438/10 |
| 6,887,339 B1 * | 5/2005 | Goodman et al. ...... | 156/345.28 |

* cited by examiner

*Primary Examiner*—Mark Paschall
(74) *Attorney, Agent, or Firm*—Oblon, Spivak, McClelland, Maier & Neustadt, P.C.

(57) ABSTRACT

A plasma processing system, method, and computer readable medium for measuring plasma impedance. The system includes a chamber configured to contain a plasma and including a chuck within an interior area of the chamber, the chuck including a support surface and a bottom surface, and a first voltage-current probe positioned at a first position located exterior to the chamber and on a radio-frequency transmission line between the chamber and a power source. The system also includes a simulation module connected to the first voltage-current probe and arranged to solve, based on measurements transmitted from the first voltage-current probe, a radio-frequency model of the radio-frequency transmission line between the first position and a second position located within the chamber.

22 Claims, 3 Drawing Sheets

METHOD AND APPARATUS FOR DETERMINING PLASMA IMPEDANCE

BACKGROUND OF THE INVENTION

1. Field of the Invention

The present invention is generally related to plasma processing and, more particularly, to a method and apparatus for determining plasma impedance using a modeled radio frequency transmission line.

2. Discussion of the Background

Plasmas are widely used in a variety of integrated circuit fabrication processes, including plasma etching and plasma deposition applications. Generally, plasmas are produced within a processing chamber by introducing a low-pressure process gas into the chamber and then directing electrical energy into the chamber for creating an electric field therein. The electric field creates an electron flow within the chamber that ionizes individual gas molecules by transferring kinetic energy to the molecules through individual electron-gas molecule collisions. The electrons are accelerated within the electric field, producing efficient ionization of the gas molecules, and the ionized particles of the gas and the free electrons collectively form what is referred to as plasma.

At all stages of plasma processing, different measurements and assessments regarding processing components and the plasma itself are required. For example, the determination of the state of the plasma at any given time is often desired. Determining plasma state in a chamber requires the experimental determination of plasma properties, which can be estimated using a measured plasma radio frequency ("RF") impedance, which can be found at a number of frequencies (e.g., full plasma impedance spectra). However, plasma is an inherently difficult medium to handle, and direct measurement of plasma RF impedance in the chamber is nearly impossible, as it is very difficult to precisely install a voltage-current ("VI") probe at a boundary between the plasma and a chamber wall. Specifically, in the case of a capacitive-coupled system, there would typically be an electrode driving the plasma, surrounded by an insulator. The RF electric potential is applied across the insulator, between the electrode and the plasma chamber wall. The insulator typically serves multiple purposes, including being vacuum tight. The ideal location for a voltage and current probe would be exactly on the interface between the plasma and the insulator, such that the current is measured passing along the electrode wall, at that plasma-insulator interface; and voltage is measured across the insulator at that same location. Only in this fashion, with the voltage and current probes directly adjacent the plasma can one directly measure the impedance that the plasma presents to the RF drive circuit. Voltage and current probes have finite dimensions (e.g. a few centimeters large, at least) and those prevent them from being installed at the very plasma-insulator interface.

Moreover, even if the probes can be made very small, and therefore, possible to install sufficiently near the interface, there still remain the mechanical and electrical problems of leading the RF signals out via wires, etc., through the insulator which needs to be vacuum tight. Furthermore, wideband RF signals typically need some sort of signal conditioning done at the place of collection to be able to be transmitted via transmission lines without deterioration, and these signal conditioning circuits need to be installed inside the insulator as well. In all, it would be advantageous to install the voltage and current probes at a more suitable location along the RF drive transmission line, and extract the plasma impedance from the impedance measurement at this location.

The interior condition of the chamber itself is further information that needs to be assessed, as deposition attributable to the plasma adheres to inner surfaces of the chamber during plasma processing. When such deposition accumulates to a certain amount, it separates from the inner surfaces to become loose particles that can contaminate a wafer being processed. However, the interior condition of a chamber is not readily apparent to a system operator, such that frequent disassembly and cleaning must be performed to ensure that the chamber is in a proper condition for plasma processing. Because of this, a chamber may be dissembled and cleaned even when the amount of deposition has not accumulated to an amount detrimental to plasma processing, resulting in unnecessary downtime of the processing tool. Moreover, when the chamber is disassembled and reassembled for preventive maintenance, no current method exists for ascertaining that the chamber exhibits the same RF characteristics as before disassembly and/or being contaminated by process.

A number of techniques have been developed to address the above-described concerns; however, such techniques have proven to be intrusive to the plasma process

BRIEF SUMMARY OF THE INVENTION

Accordingly, one objective of the present invention is to solve or reduce the above described and/or other problems in the prior art.

Another object of the present invention is to provide an accurate measurement of plasma RF impedance at a boundary between the plasma and a chamber wall.

These and other objects may be provided by a method and apparatus for plasma processing that includes modeling a portion of a RF transmission line supplying a component (e.g., coil, electrode, or antenna) configured to excite plasma in a chamber.

In accordance with a first aspect of the present invention, a plasma processing system includes a chamber configured to contain a plasma and including a chuck within an interior area of the chamber, the chuck including a support surface and a bottom surface, and a first voltage-current probe positioned at a first position located exterior to the chamber and on a radio-frequency transmission line between the chamber and a power source. The system also includes a simulation module connected to the first voltage-current probe and arranged to solve, based on measurements transmitted from the first voltage-current probe, a radio-frequency model of the radio-frequency transmission line between the first position and a second position located within the chamber.

In another aspect of the invention, a plasma processing system includes a chamber configured to contain a plasma, and a probe arranged to measure at least one of voltage and current, and positioned at a first position located exterior to the chamber and on a radio-frequency transmission line between the chamber and a power source. The system further includes means for receiving measurements from the probe, for solving a radio-frequency model of the radio-frequency transmission line between the first position and a second position located within the chamber based on the received measurements, and for calculating a load radio-frequency impedance based on the solved radio-frequency model.

In yet another aspect of the invention, a method for determining a load impedance in a chamber includes providing a transmission line between a power source and the chamber, and measuring at least one of voltage and current at a first position located exterior to the chamber and on the transmission line. A model of the transmission line between the first position and a second position located within the chamber is solved based on results of the measuring step, and the load impedance at the second position is calculated based on the solved model.

In yet another aspect of the invention, a plasma processing system includes means for transmitting alternating current (AC) power from an AC power source to a processing chamber, and means for measuring at least one of voltage and current at a first position located exterior to the chamber and on the means for transmitting. The system also includes means for solving a model of the means for transmitting between the first position and a second position located within the chamber based on results of the means for measuring, and means for calculating the load impedance at the second position based on the solved model.

In still another aspect of the invention a computer readable medium contains program instructions for execution on a processor, which when executed by the computer system, cause the processor to perform the steps of inputting a measurement of at least one of voltage and current at a first position located exterior to a chamber of a semiconductor processing system and on a transmission line provided between a power source and the chamber, and solving a model of the transmission line between the first position and a second position located within the chamber based on the measurement of a transmission line. The processor is also caused to calculate the load impedance at the second position based on the solved model.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
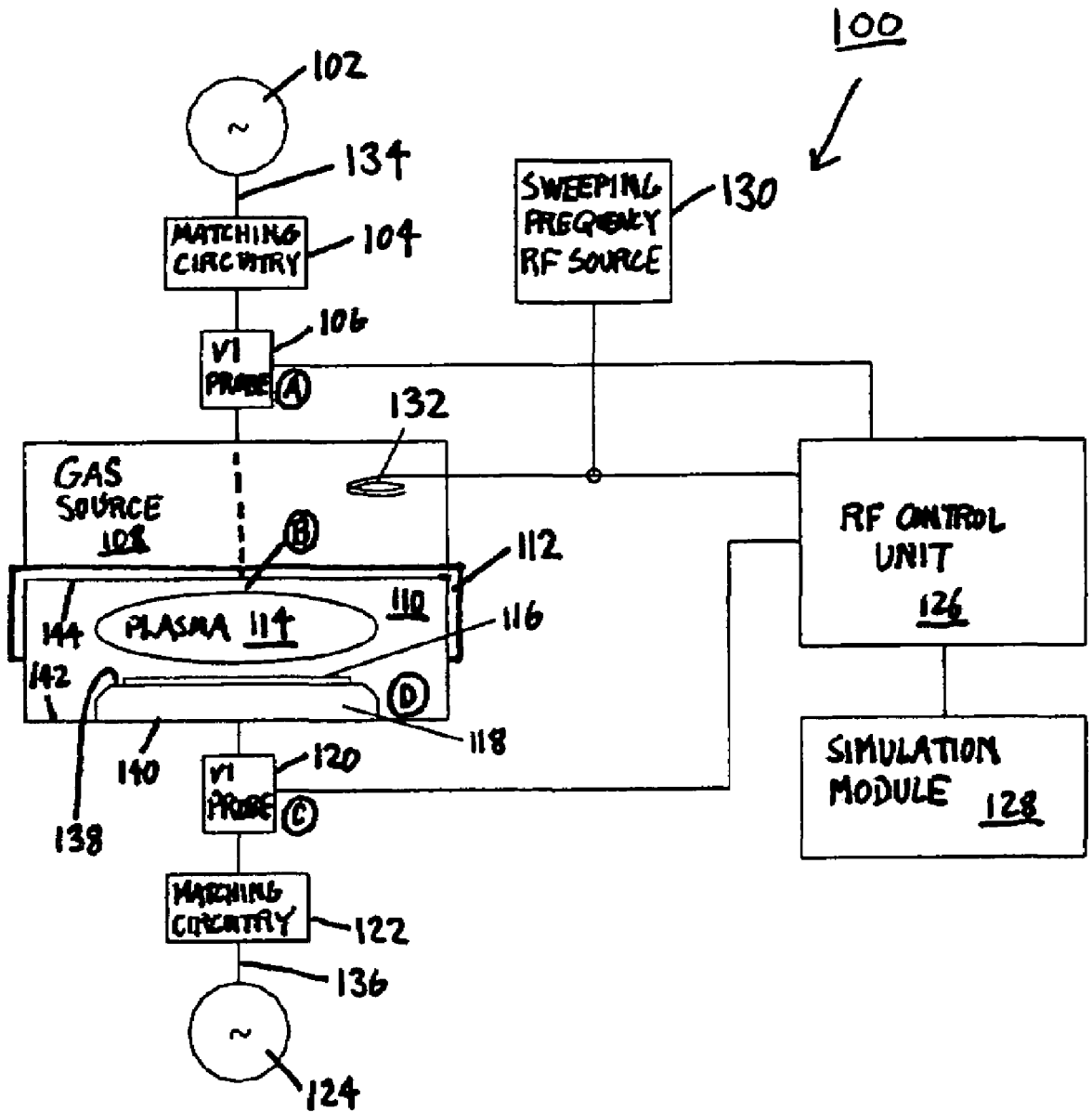
FIG. 1 is a schematic view of a plasma processing system in accordance with an exemplary embodiment of the present invention.

Referring now to the drawings, where like reference numeral designations identify the same or corresponding parts throughout the several views, several embodiments of the present invention are next described.

FIG. 1 illustrates a plasma processing system 100, which can be configured as an inductively coupled plasma (ICP) system, a capacitively coupled plasma (CCP) system, or a magnetically enhanced reactive ion etching (MERIE) system, for example. System 100 is primarily used to provide etching of a wafer 116 within chamber 110, where wafer 116 is supported by a support surface 138 of chuck 118. A bottom surface 140 of chuck 118 contacts an interior surface 142 of chamber 110. The etching, deposition, or other plasma processing of wafer 116 is performed using a plasma 114 created from gas provided by gas source 108.

Plasma 114 is driven by a main RF power source 102, which transmits RF power via an RF matching circuitry 104 to an excitation element 112. Excitation element 112 is configured to excite gas transferred from gas source 108 inside chamber 110, thereby creating plasma 114. Excitation element 112 can be arranged as an ICP coil, a CCP upper electrode, or any other means for creating an electric field inside chamber 110.

System 100 also includes a VI probe 106, which is used to measure voltage and current on the RF transmission line 134. In the embodiment of FIG. 1, VI probe 106 is positioned on RF transmission line 134 at a position A, which is located exterior to chamber 110. Based on the measurements of VI probe 106 (i.e., voltage and current), RF impedance can be calculated at position A. Position B denotes the boundary between plasma 114 and the interior surface 144 of chamber 110. In order to measure the RF impedance of plasma 114, one would have to locate a VI probe at position B; however, as mentioned before, such positioning is difficult and impractical.

The present invention addresses the above problem by using an RF simulation to model the portion of RF transmission line 134 between positions A and B (indicated by the dotted-line portion of transmission line 134). Using the modeled portion, the measured impedance at position A can be transformed to the impedance at position B, thereby providing the desired plasma RF impedance. Provided in system 100 is a simulation module 128, which is configured to run an electromagnetic frequency-dependent simulation of transmission line 134 using a software tool capable of solving an RF model. The software can be, for example, a high-frequency electromagnetic finite element code, such as ANSYS, written by ANSYS Inc., Southpointe, 275 Technology Drive, Canonsburg, Pa. 15317, or Ansoft HFSS, written by ANSOFT Corp., Four Station Square, Suite 200, Pittsburgh, Pa., 15219, or any other commercial or custom-developed code. Simulation module 128 is connected to VI probe 106 through a RF control unit 126, and voltage and current measurements are transmitted from VI probe 106 to both RF control unit 126 and simulation module 128. Alternatively, an RF model for a portion of transmission line 134 can be solved on an off-tool solver that is part of a simulation support infrastructure for a fabrication facility encompassing system 100 such as that disclosed in U.S. non-provisional patent application titled SYSTEM AND METHOD FOR USING FIRST-PRINCIPLES SIMULATION TO FACILITATE A SEMICONDUCTOR MANUFACTURING PROCESS, filed on Sep. 30, 2003 under attorney docket number 236518US, the entire contents of which is incorporated herein by reference. Further, using distributed processing and network techniques, the RF model can be solved outside the fabrication facility entirely or can be obtained from an on-tool or off-tool simulation results library.

Simulation module 128 presents the RF electromagnetic model results in either impedance matrix form $[Z_{AB}]$, or in scattering matrix form $[S_{AB}]$; in the latter case, a conversion into impedance matrix form $[Z_{AB}]$ is required. The impedance matrix, whose elements are, in general, functions of RF frequency, contains a complete description of the segment of transmission line 134 between points A and B, necessary for transforming the impedance at one end, to that at the other end. The impedance matrix can be used to model an equivalent circuit, such as a T, L or Π network, including a plasma load $Z_L$ attached at an output end.

Figure 2:
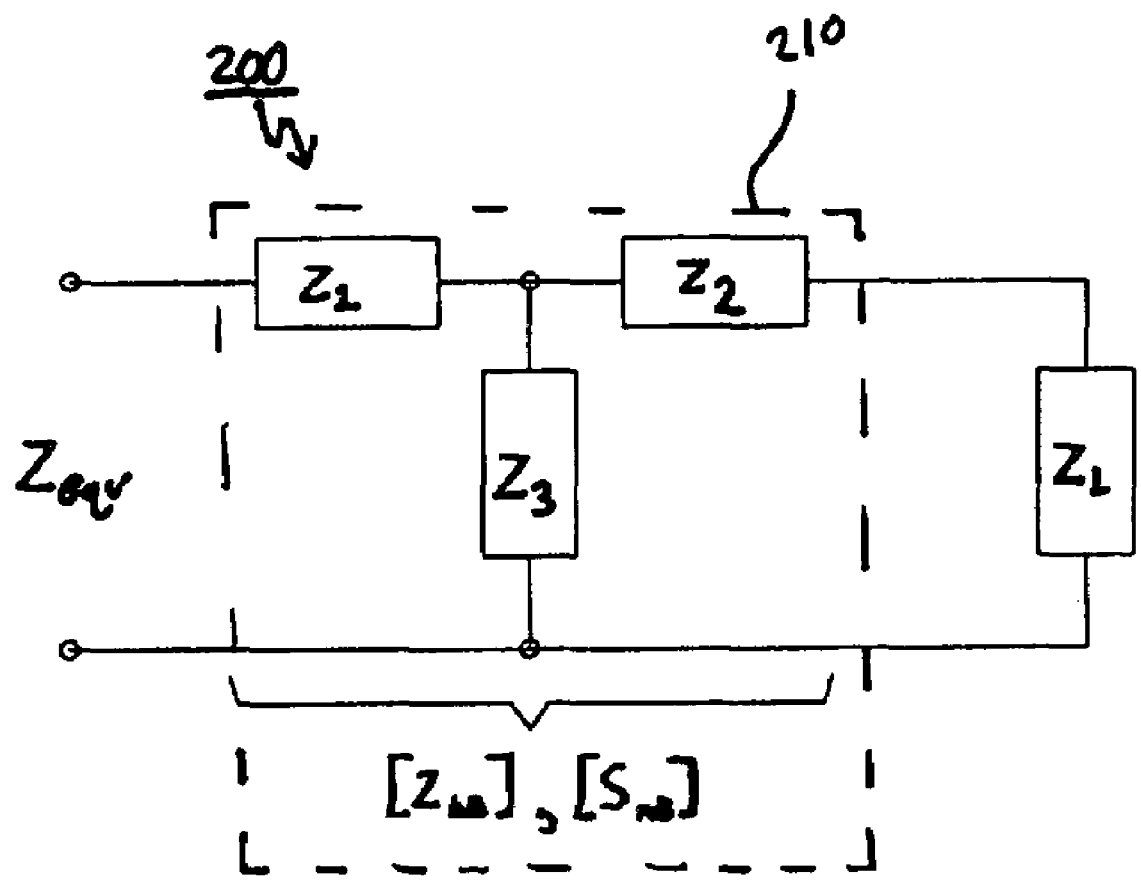
FIG. 2 is an equivalent circuit corresponding to a simulated model of a transmission line portion in FIG. 1.

FIG. 2 shows an equivalent circuit 200 including a network 210 shown as a T network characterized by the RF transmission structure A–B impedance matrix $[Z_{AB}]$, and the plasma load $Z_L$. The transmission structure is modeled as three lumped impedances $Z_1$, $Z_2$, and $Z_3$, which are calculated from impedance matrix $[Z_{AB}]$ elements by equations disclosed in, for example, David M. Pozar, *Microwave Engineering*, 2nd Ed., John Wiley, chapter 4 (1998), herein incorporated by reference in its entirety.

The impedance measured at position A is denoted as $Z_{eqv}$ and includes the contributions of the plasma load $Z_L$ and of transmission line 134. Using AC circuit equations, having calculated $Z_1$, $Z_2$, and $Z_3$, and having measured $Z_{eqv}$ using VI probe 106 at position A, one can readily obtain the plasma load impedance $Z_L$ from the following equation: $Z_L=(Z_3(Z_1-Z_{eqv}))/(Z_{eqv}-Z_1-Z_3)$. The calculation of plasma load impedance $Z_L$ can be performed by simulation module 128, control unit 126, or an additional processing unit.

As mentioned before, the transmission line can be represented by a number of different equivalent circuits. The use of a Π network, rather than a T network, would require the use of a different equation for impedance transformation from the one given above, and the derivation of these equations is well known in the electrical arts, from AC circuit theory. The T network equivalent circuit may be advantageous in that it reduces the transmission line into three discrete elements, one of which is typically a shunt capacitor, represented by impedance $Z_3$, and the remaining two being series inductors. The examination of the lumped circuit equivalents of these impedances, e.g. the capacitor capacitance, and inductor inductances, provides a way of performing a quick "sanity check" of the RF simulation model results, as these values can be roughly estimated using the known transmission line geometry. For example, the shunt capacitance $C_3$, corresponding to impedance $Z_3$, can be estimated using the length, average circumference, and average dielectric layer thickness of transmission line 134, and the simulated and estimated capacitances should agree reasonably for the kind of approximations made during the rough capacitance estimation.

The plasma impedance $Z_L$ can be used for a number of different diagnostic purposes, such as determining properties of plasma 114 and detecting faults in plasma generation in chamber 110, such as detection of arcing, for example. By generating frequency-dependent impedance matrix components from the RF model solved by simulation module 128, and by using VI probe 106 to measure at multiple frequencies (e.g., at plasma harmonic frequencies present only when plasma 114 is lit), a full plasma impedance spectrum can be obtained by repeating the above calculations for these multiple frequencies, which allows for more advanced and reliable diagnostics to be developed. The multiple frequencies are not restricted to only harmonics of the plasma RF frequency, but can be other frequencies of interest, such as harmonic sidebands, etc. With currently available computing power, this process can be performed in real time, enabling real-time multi-frequency plasma diagnostics, provided the RF model is solved in advance for multiple frequencies, and the results are stored in control unit 126, simulation module 128, or a results library. In the future, with increasing available computer power, it is expected that entire RF simulations can be done in real time, during the wafer process.

In an alternative embodiment, referring to FIG. 1, a second RF power source 124 is located below chuck 118 such that RF power from power source 124 can be used to RF-bias chuck 118 to attract plasma ions to it. Position D indicates the location of support surface 138 within chamber 110. Power source 124 is connected to chuck 118 via an RF matching circuitry 122, and a second VI probe 120 is provided at location C to measure current and voltage along a transmission line 136. When formation of plasma 114 is performed using only chuck 118, VI probe 120 can be used to sense RF impedance, and simulation module 128 solves an RF model of a portion of transmission line 136 between position C and position D. This embodiment is particularly suitable for plasma chambers that also excite the plasma via the chuck RF drive, e.g. when there is no excitation element 112, such as an upper electrode or inductive-coupled plasma coil.

Situations exist where the RF impedance of chamber 110 needs to be measured when no plasma is contained in chamber 110, in which case the RF power sources 102 and 124 are both turned off or set at an extremely low power level. The impedance $Z_L$ measured from chamber 110 in a vacuum or atmospheric pressure state can be used to determine the condition of chamber 110. For example, this information can be used to determine the amount of chemical byproducts covering interior portions of chamber 110 or the amount of erosion of these parts. Empty chamber impedance, from here referred to as $Z_C$, and equal $Z_L$ under these conditions, is also useful in determining the exact impedance $Z_P$ of plasma 114, by subtracting the contribution of chamber 110 itself in the measured load impedance $Z_L$ under plasma conditions. For this subtraction, a suitable equivalent circuit consisted of the plasma and chamber impedances can be used, such as a parallel circuit, and AC circuit equations can be derived using techniques known in the art to express the plasma impedance $Z_P$ in terms of measured load impedance $Z_L$ and the empty chamber impedance $Z_C$. In this preferred fashion, a much more accurate measurement of plasma properties can be obtained, and it applies to both cases when the plasma impedance is measured via VI probe 106, and VI probe 120.

The following alternative embodiment can be used to measure empty chamber impedance where the operation of RF power supplies 102 and 124 at very low power levels (e.g., lower than plasma ignition levels) is not feasible. An antenna 132 can be installed in chamber 110, preferably outside plasma 114, but in RF contact with the interior of chamber 110. Antenna 132 can be excited using a frequency sweep generator 130 (or an ultra wide-band RF source) to excite the entire chamber 110 such that RF measurements can be made at VI probes 106 and/or 120, as described before.

The frequency-dependent RF impedance spectra measured at VI probe 106 after chamber 110 is excited with antenna 132 can be used as a diagnostic tool in a number of different ways. For example, to determine the condition of chamber 110, and to compare a pre-disassembly condition to an after-assembly condition, one can take chamber impedance measurements immediately after assembly to obtain a baseline impedance spectrum. Subsequent measurements can be made, and features in the subsequently-measured impedance spectra can indicate the condition of the plasma-exposed parts of chamber 110 (e.g., indicating the amount of coating and/or level of erosion). From measured spectra, one can determine when preventive maintenance of chamber 110 is necessary without regards to, for example, an actual number of wafers processed since previous maintenance, as chamber condition is assessed directly. By reducing unnecessary downtime, and by extending the lifetimes of spares and consumable parts, considerable savings can be realized by device manufacturers.

RF modeling and simulation can also be used to predict the impedance spectra of chamber 110, when excited by antenna 132, under various coating and erosion conditions, and model results can be compared to actually-measured spectra (using any of the above methods of excitation) to obtain a useful chamber condition diagnostic tool. Such diagnostic information can be used for, among other functions, condition detection, fault detection, and issuing advance and actual maintenance warnings in relation to abovementioned chamber conditions.

Figure 3:
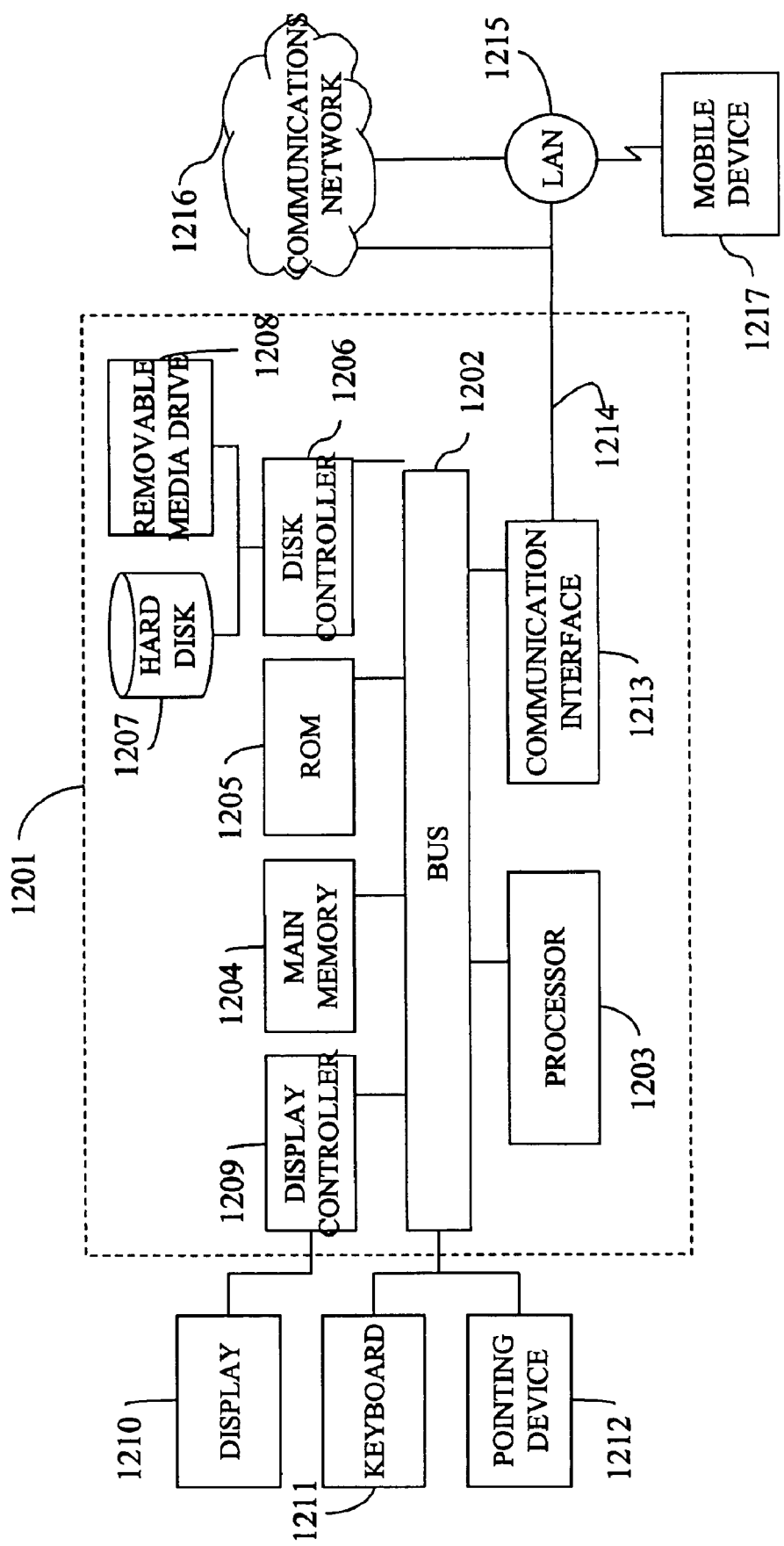
FIG. 3 illustrates a computer system upon which an embodiment of the present invention may be implemented.

FIG. 3 illustrates a computer system 1201 upon which an embodiment of the present invention may be implemented. The computer system 1201 may be used as the RF control unit 126 and/or simulation module 128 to perform any or all of the functions of these units described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A plasma processing system, comprising:
   a chamber configured to contain a plasma and including a chuck within an interior area of the chamber, the chuck including a support surface and a bottom surface;
   a first voltage-current probe positioned at a first position located exterior to the chamber and on a radio-frequency transmission line between the chamber and a power source; and
   a simulation module connected to the first voltage-current probe and arranged to solve, based on measurements transmitted from the first voltage-current probe, a radio-frequency model of the radio-frequency transmission line between the first position and a second position located within the chamber.

2. The plasma processing system of claim 1, wherein the simulation module is further arranged to calculate a load radio-frequency impedance at the second position based on the solved radio-frequency model.

3. The plasma processing system of claim 1, wherein the second position is located at a boundary between the plasma contained in the chamber and a first interior surface of the chamber.

4. The plasma processing system of claim 3, wherein the chuck is positioned on a second interior surface of the chamber, the second interior surface being an opposite side of the first interior surface.

5. The plasma processing system of claim 1, wherein the support surface is located between the bottom surface and the first voltage-current probe.

6. The plasma processing system of claim 1, wherein the second position is located at the support surface.

7. The plasma processing system of claim 6, wherein the bottom surface is located between the support surface and the first voltage-current probe.

8. The plasma processing system of claim 1, further comprising a second voltage-current probe positioned at a third position located exterior to the chamber and on an opposite side of the chamber relative to the first voltage-current probe.

9. The plasma processing system of claim 1, further comprising an antenna positioned within the chamber and configured to excite the interior area of the chamber at varying frequencies.

10. The plasma processing system of claim 1, wherein said simulation module is configured to determine an RF impedance of a plasma within the chamber based on said measurements taken from the first voltage-current probe and said radio-frequency model of the radio-frequency transmission line between the first portion and the second portion.

11. A plasma processing system, comprising:
    a chamber configured to contain a plasma;
    a probe arranged to measure at least one of voltage and current, and positioned at a first position located exterior to the chamber and on a radio-frequency transmission line between the chamber and a power source; and
    means for receiving measurements from the probe, for solving a radio-frequency model of the radio-frequency transmission line between the first position and a second position located within the chamber based on the received measurements, and for calculating a load radio-frequency impedance based on the solved radio-frequency model.

12. A method for determining a load impedance in a chamber, comprising:
providing a transmission line between a power source and the chamber;
measuring at least one of voltage and current at a first position located exterior to the chamber arid on the transmission line;
solving a model of the transmission line between the first position and a second position located within the chamber based on results of the measuring step; and
calculating the load impedance at the second position based on the solved model.

13. The method of claim 12, further comprising:
creating a plasma within the chamber.

14. The method of claim 12, wherein the second position is located at a boundary between the created plasma and an interior surface of the chamber.

15. The method of claim 12, further comprising:
exciting an interior area of the chamber at varying frequencies.

16. The method of claim 12, further comprising using an equivalent circuit to represent at least a portion of the transmission line.

17. The method of claim 15, wherein said using an equivalent circuit comprises using at least one of a T-network, an L-network and a □ network to represent at least a portion of the transmission line.

18. The method of claim 17, wherein said using an equivalent circuit comprises using a T-network to represent at least a portion of the transmission line.

19. The method of claim 12, wherein said calculating the load impedance comprises calculating an RF impedance of a plasma within the chamber based on said measuring of at least one of a voltaging current and said solving a model.

20. A plasma processing system comprising:
means for transmitting alternating current (AC) power from an AC power source to a processing chamber;
means for measuring at least one of voltage and current at a first position located exterior to the chamber and on the means for transmitting;
means for solving a model of the means for transmitting between the first position and a second position located within the chamber based on results of the means for measuring; and
means for calculating the load impedance at the second position based on the solved model.

21. A computer readable medium containing program instructions for execution on a processor, which when executed by the computer system, cause the processor to perform the steps of:
inputting a measurement of at least one of voltage and current at a first position located exterior to a chamber of a semiconductor processing system and on a transmission line provided between a power source and the chamber;
solving a model of the transmission line between the first position and a second position located within the chamber based on the measurement of a transmission line; and
calculating the load impedance at the second position based on the solved model.

22. The computer readable medium of claim 21, further containing program instructions for execution on the processor, which when executed by the computer system caused the processor to calculate an RF impedance of a plasma within the chamber based on said measurement of at least one of a voltaging current and said model of a transmission line between the first position and second position.

* * * * *